(12) United States Patent
Wada

(10) Patent No.: US 6,639,300 B2
(45) Date of Patent: Oct. 28, 2003

(54) SEMICONDUCTOR INTEGRATED CIRCUIT HAVING AN INTEGRATED RESISTANCE REGION

(75) Inventor: Jun Wada, Nakakoma (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/774,583

(22) Filed: Feb. 1, 2001

(65) Prior Publication Data

US 2002/0013033 A1 Jan. 31, 2002

(30) Foreign Application Priority Data

Mar. 24, 2000 (JP) .......................... 2000-085323

(51) Int. Cl.⁷ .................... H01L 29/00; H01L 21/8222; H01L 21/20
(52) U.S. Cl. .................... 257/539; 257/542; 257/543; 438/330; 438/331; 438/332; 438/382
(58) Field of Search ................ 257/539, 536, 257/540, 541, 542, 543; 438/330–332, 382

(56) References Cited

U.S. PATENT DOCUMENTS 5,479,044 A * 12/1995 Narahara et al. ........... 257/533
6,083,785 A * 7/2000 Segawa et al. ............. 438/238
6,384,433 B1 * 5/2002 Barratt et al. ............... 257/197

FOREIGN PATENT DOCUMENTS

JP 52-50174 4/1977
JP 54-69089 6/1979

* cited by examiner

Primary Examiner—Olik Chaudhuri
Assistant Examiner—Neal Berezny
(74) Attorney, Agent, or Firm—Armstrong, Westerman & Hattori, LLP

(57) ABSTRACT

A semiconductor integrated circuit device comprises an active device and a resistance element formed monolithically on a common substrate wherein the resistance element includes a dummy pattern having a layered structure identical with a layered structure of the active device, and first and second electrodes are provided inside a mesa structure provided for the resistance element with a separation from a sidewall of the mesa structure, the first and second electrodes being formed in correspondence to openings formed in the dummy pattern.

12 Claims, 11 Drawing Sheets

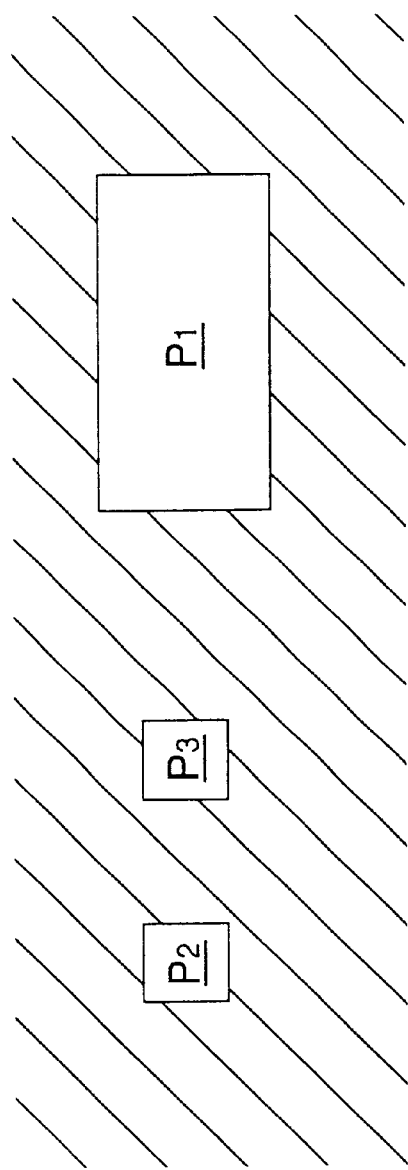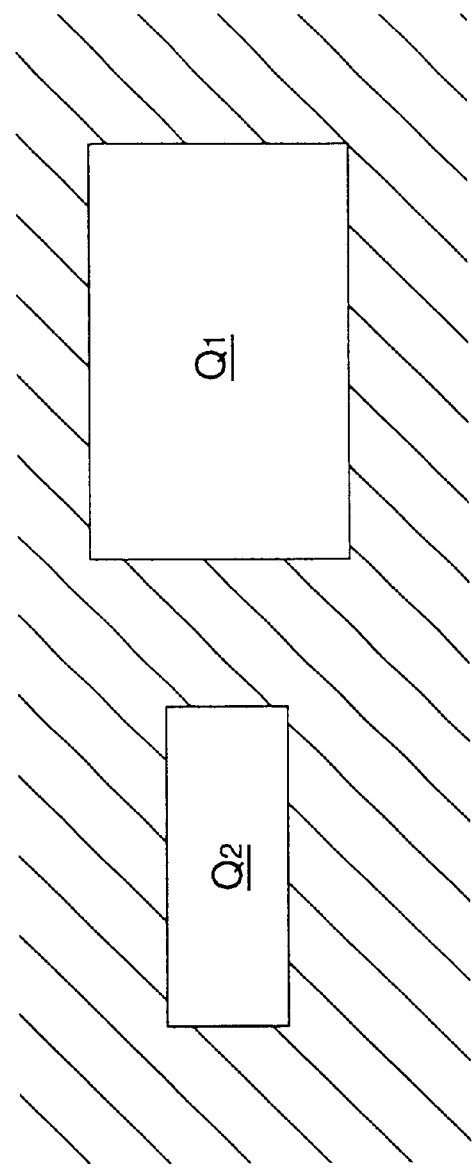
FIG. 2A
RELATED ART
FIG. 2B
RELATED ART

A-A'

B-B''

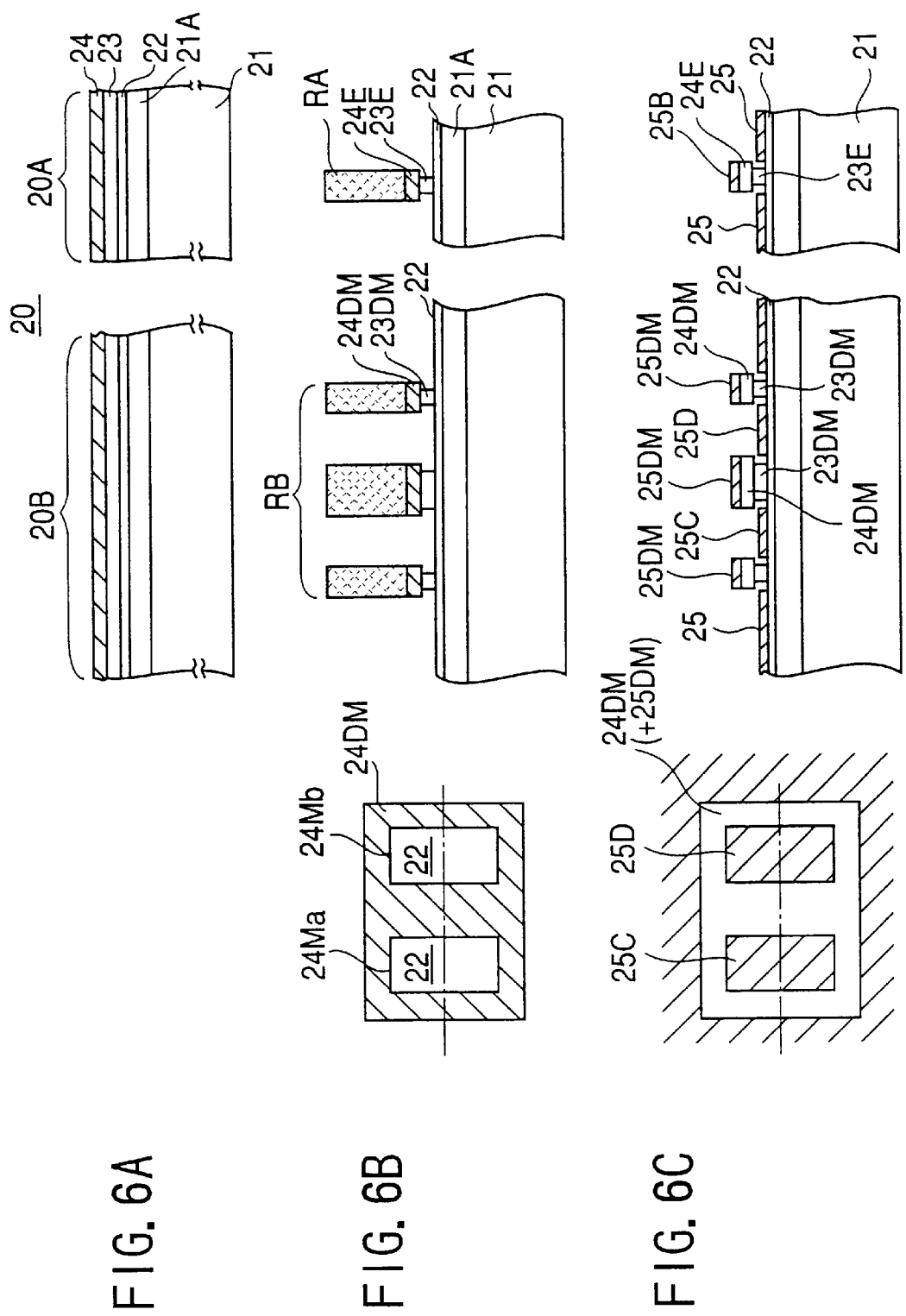

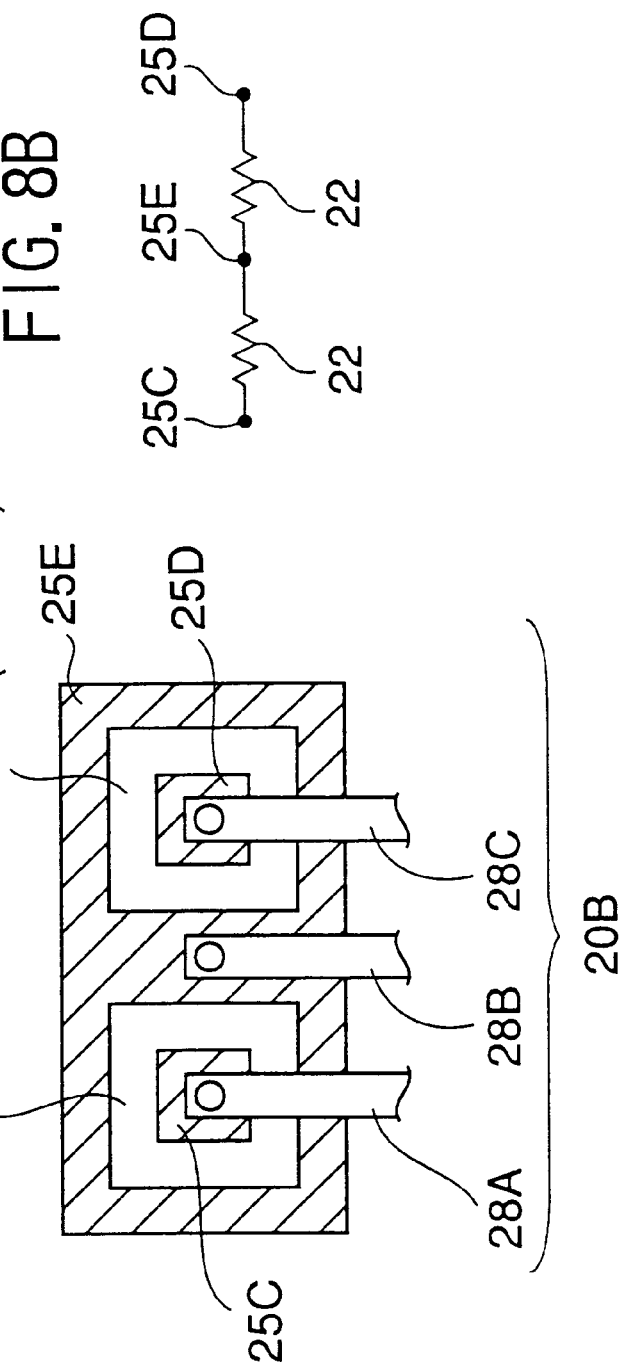

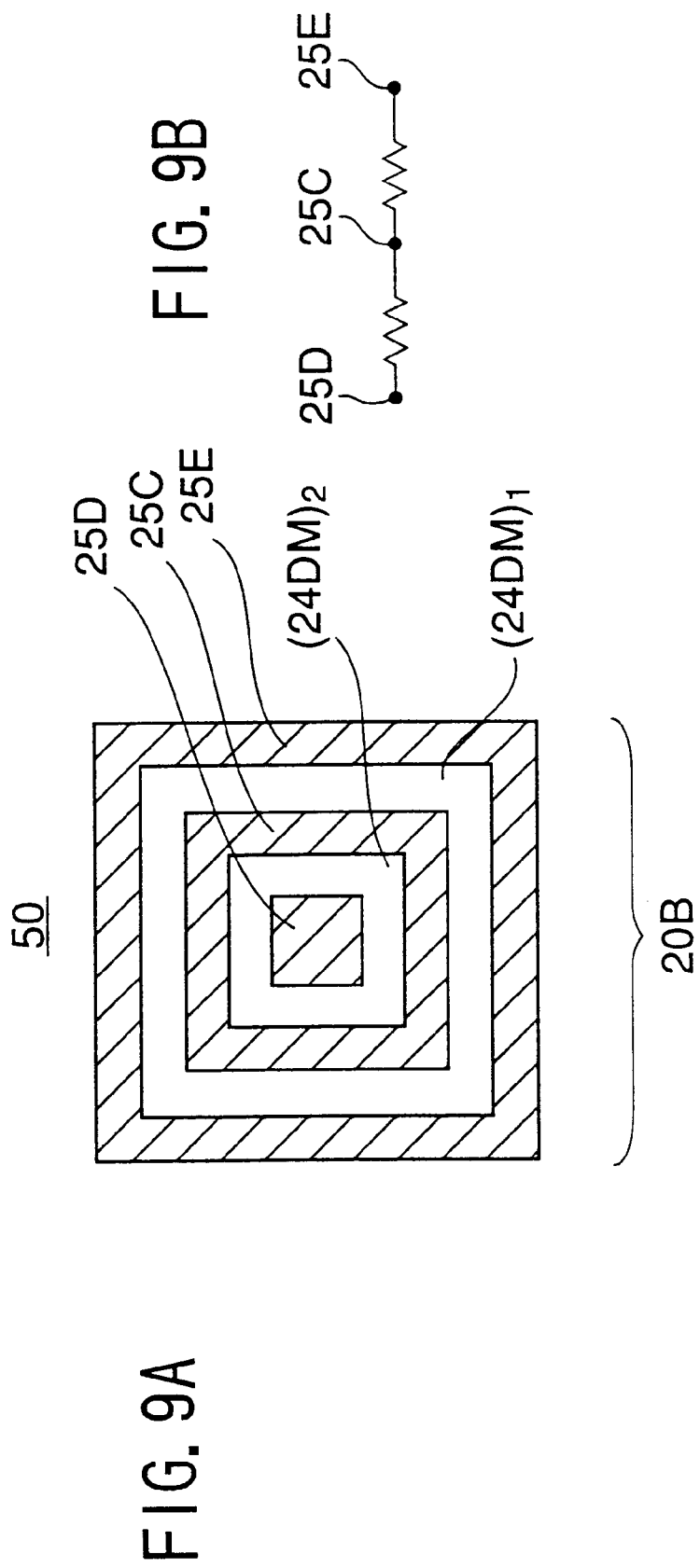

FIG. 10A
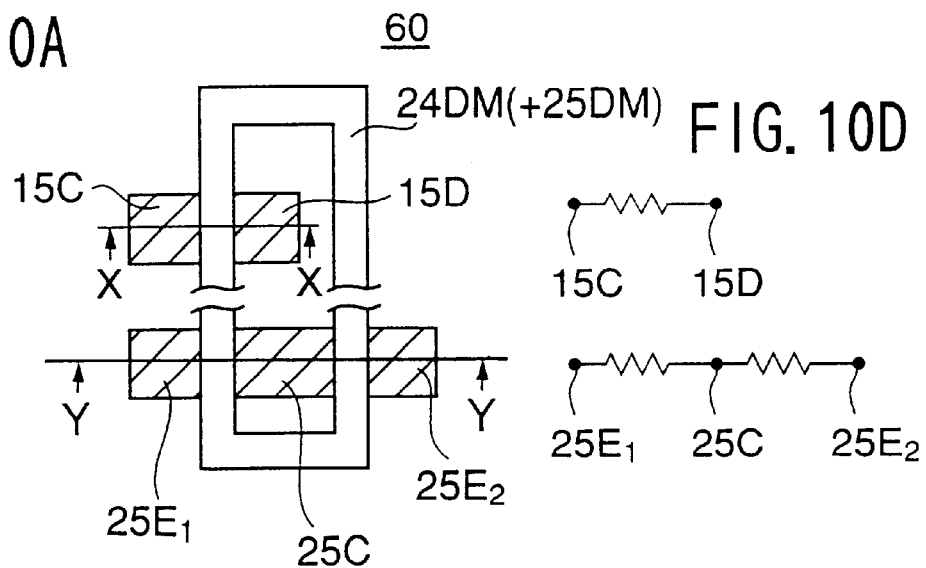
FIG. 10D
FIG. 10B
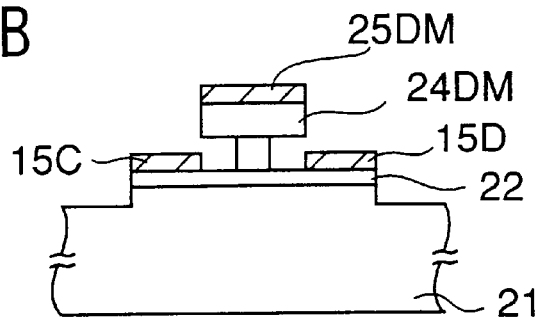
FIG. 10C
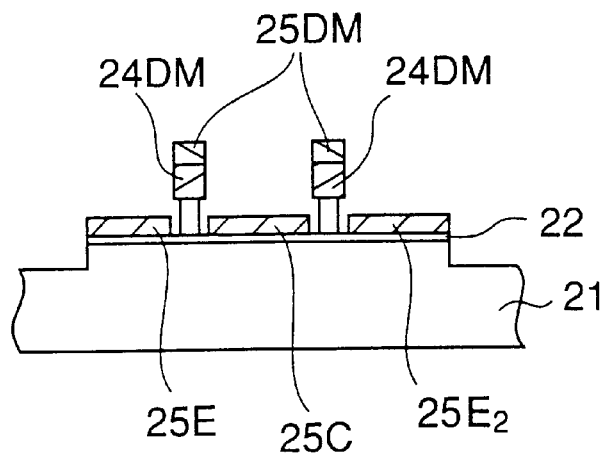

SEMICONDUCTOR INTEGRATED CIRCUIT HAVING AN INTEGRATED RESISTANCE REGION

CROSS-REFERENCE TO RELATED APPLICATION

The present application is based on Japanese priority application No. 2000-085323 filed on Mar. 24, 2000, the entire contents of which are hereby incorporated by reference.

BACKGROUND OF THE INVENTION

The present invention generally relates to semiconductor devices and more particularly to a semiconductor integrated circuit including a resistance region formed on a substrate integrally with an active device and a fabrication process thereof.

Generally, semiconductor devices are provided in the form of a semiconductor integrated circuit in which active devices such as transistors are formed on a substrate monolithically together with passive devices including resistances and/or capacitances.

In the fabrication process of semiconductor integrated circuits, it is preferable that these passive devices are formed simultaneously with the active devices, without increasing the number of the fabrication steps. Further, it is preferable that the active devices are formed with minimum size for maximizing the operational speed thereof.

FIGS. 1A and 1B are diagrams showing the construction of a compound semiconductor integrated circuit device 10 of a related art in which a hetero-bipolar transistor (HBT) and a cooperating resistance element are integrated, wherein FIG. 1A shows the semiconductor integrated circuit in a plan view, while FIG. 1B shows the semiconductor integrated circuit in a cross-sectional view taken along a line 1–1' of FIG. 1A.

Referring to the cross-sectional view of FIG. 1B, it can be seen that a semi-insulating GaAs substrate 11 is provided with a collector layer 11A of n-type GaAs, and a base layer 12 of thin p-type GaAs is formed epitaxially on the semi-insulating GaAs substrate 11. Further, an emitter layer 13 of $n^+$-type GaInP is formed on the base layer 12 epitaxially.

The substrate 11 is divided into an active device region 10A and a resistance-element region 10B by a device-isolation trench 11B, wherein it can be seen that a device-isolation region 11C of high resistance is formed inside the device-isolation trench 11B by an ion implantation process. Thus, the device-isolation trench 11B thus formed defines the mesa structure for the active device region 10A and also the mesa structure for the resistance-element region 10B.

In the active device region 10A, it should be noted that the emitter layer 13 forms an emitter pattern of a reduced lateral size on the base layer 12 so as to minimize the base-emitter capacitance, and a ring-shaped base electrode 15A is formed on the surface of the base layer 12 thus exposed as represented in FIG. 1A. Further, an emitter electrode 14 is formed on the emitter pattern 13, wherein the emitter electrode 14 extends laterally as a result of the lateral etching process applied to the emitter pattern 13 for reducing the size, and hence the area, thereof. Thereby, the emitter electrode 14 forms an overhang structure on the emitter pattern 13.

On the resistance-element region 10B, on the other hand, electrodes 15C and 15D are formed on the same base layer 12. Thereby, there is formed a resistance element having a resistor body provided by the base layer 12 and the electrodes 15C and 15D as terminals. In the description hereinafter, the resistance element thus formed in the region 10B will be designated also by a numeral 10B. Similarly, the HBT formed on the active region 10A will be designated also by a numeral 10A.

In such a semiconductor integrated circuit of FIGS. 1A and 1B, it is preferable to form the resistance element and the active device simultaneously by a common process. Thus, there is proposed a process to form the base electrode 15A of the HBT 10A and the electrodes 15C and 15D of the resistance element 10B simultaneously.

In more detail, deposition of a conductive layer constituting the base electrode 15A is made on the active device region 10A while using the emitter electrode 14 as a mask, after the step of forming the emitter pattern 13 on the base layer 12 and after the step of forming the emitter electrode. As a result of the deposition of the conductive layer thus conducted while using the emitter electrode 14 as a self-alignment mask, an electrode pattern 15B of the same composition as the base electrode 15A is formed also on the emitter electrode 14.

As a result of the deposition of the conductive layer, the electrodes 15C and 15D are formed at the same time, as noted previously. In view of the fact that the electrodes 15C and 15D are used as the different terminals of the resistance element, it is necessary that the electrodes 15C and 15D are isolated from each other, and thus, it has been necessary to apply a patterning process using a mask for forming the electrodes 15C and 15D.

In view of the circumstances noted above, it has been necessary to use a mask having mask openings P1–P3 corresponding respectively to the electrode patterns 15A, 15C and 15D as represented in FIG. 2A for patterning the electrodes 15C and 15D, while no such a mask is actually needed for patterning the base electrode 15A. It should be noted that the emitter electrode 14 can be used as a self-aligned mask during the process of forming base electrode 15A of the HBT 10A.

In the fabrication process of the semiconductor integrated circuit 10 of the related art, it should be noted that another mask process, using a mask pattern having mask openings Q1 and Q2 respectively corresponding to the mesa region 10A and the mesa region 10B represented in FIG. 2B, is necessary for forming the device isolation trench 11B.

Thus, the fabrication process of the semiconductor integrated circuit 10 of the related art includes two different mask processes, one using the mask pattern of FIG. 2A for forming the electrodes 15A, 15C and 15D, and the other using the mask pattern of FIG. 2B for forming the mesa regions 10A and 10B.

In such a process that uses two different mask processes, there inevitably arises the problem of mask misalignment. Thus, in order to tolerate possible mask misalignment, it has been necessary to secure a sufficiently large area for the mesa regions 10A and 10B, while such an increase of the mesa area invites unwanted increase of parasitic capacitance and resultant decrease of the operational speed of the HBT. In FIGS. 1A and 1B it should be noted that the drawings represent resist patterns 16A and 16B that are formed by the mask pattern of FIG. 2B, wherein the resist pattern 16A corresponds to the resist opening $Q_1$ while the resist pattern 16B corresponds to the resist opening $Q_2$.

The foregoing problem of increased parasitic capacitance of HBT may be eliminated when a self-alignment mask similar to that used for the active device region 10A is provided also in the resistance-element region 10B and make the electrodes 15C and 15D separate as a result of use of such a self-alignment mask. In this case, the mask process for patterning the electrodes 15C and 15D by using the mask of FIG. 2A can be omitted. Thus, when successful, such a process would minimize the area of the HBT 10A and simultaneously simplify the fabrication process of the semiconductor integrated circuit 10.

FIGS. 3A–3C represents the case of fabricating a semiconductor integrated circuit device by using a self-alignment mask also in the resistance-element region 10B according to the foregoing approach. It should be noted that FIGS. 3A–3C merely represent one possible option of eliminating the problem pertinent to the fabrication process of the semiconductor integrated circuit 10 of FIGS. 1A and 1B and does not represent a known or prior art process. In FIGS. 3A–3C, those parts corresponding to the parts described previously are designated by the same reference numerals and the description thereof will be omitted.

Referring to FIGS. 3A and 3B, it can be seen that the resistance-element region 10B of the semiconductor integrated circuit 10 now includes a dummy emitter region 13A having a reduced lateral size, and a dummy-emitter electrode 14A corresponding to the emitter electrode 14 is formed on the dummy emitter region 13A so as to form an overhang structure.

According to the process of FIGS. 3A and 3B, a conductive layer is deposited on the base layer 12 in correspondence to the resistance-element region 10B simultaneously to the step of forming the base electrode 15A of the HBT 10A, while using the dummy-emitter electrode 14A as a self-alignment mask. As a result of use of the self-alignment mask 14A, the deposited conductive layer form the electrode 15C at one side of the mask 14A and the electrode 15D at the other side of the mask 14A. In order to assume separation of the electrodes 15C and 15D from each other, the dummy-emitter electrode 14A is formed to have a width slightly larger than the width of the electrodes 15C or 15D. Associated with the formation of the electrodes 15C and 15D, a dummy electrode pattern 15E having a substantially identical composition with the electrodes 15C and 15D is formed on the dummy-emitter electrode 14A.

After formation of the base electrode 15A and the terminal electrodes 15C and 15D, the mesa regions 10A and 10B are formed by an ion milling process or a dry etching process while using a resist mask including resist patterns Q1 and Q2 respectively in correspondence to the mesa regions 10A and 10B as represented in FIG. 3C.

According to such an approach, it is no longer necessary to use two masks in two separate steps and the area of the active device region 10A for the HBT should be minimized.

However, the semiconductor integrated circuit thus formed by the process of FIGS. 3A and 3B has a serious problem of a conductive pattern 15X which may be formed so as to surround the mesa region 10B as represented in FIGS. 4A–4C associated with the patterning step of forming the mesa region for the resistance-element region 10B. Thus, there is a substantial risk in such a semiconductor integrated circuit that the resistance element cause short-circuit. In FIGS. 4A–4C, it should be noted that those parts corresponding to the parts described previously are designated by the same reference numerals and the description thereof will be omitted. In the drawings, it should be noted that FIG. 4A represents the resistance-element region 10B in a plan view while FIG. 4B represents the same resistance-element region 10B in a cross-sectional view taken along a line A–A' in FIG. 4A. Further, FIG. 4C represents the resistance-element region 10B in a cross-sectional view taken along a line B–B' represented in FIG. 4C.

Referring to FIGS. 4A–4C. it should be noted that the mesa patterning process using the resist pattern 16B may cut a part of the electrode patterns 15C and 15D as represented in FIG. 4B. In such a case, the conductive pattern 15X can be formed on the sidewall of the mesa structure 10B as a patterning residue as represented in FIGS. 4A and 4C. As noted previously, such a patterning residue 15X can cause the problem of short-circuit of the electrodes 15C and 15D.

SUMMARY OF THE INVENTION

Accordingly, it is a general object of the present invention to provide a novel and useful semiconductor integrated circuit wherein the foregoing problems are eliminated.

Another and more specific object of the present invention is to provide a semiconductor integrated circuit device having an active device and a resistance element formed monolithically on a substrate wherein the area of the active device is minimized and the risk of short-circuit of the resistance element is eliminated at the same time.

Another object of the present invention is to provide a semiconductor integrated circuit device, comprising:

a substrate carrying thereon an epitaxial layer;

a resistance element formed on a first region of said epitaxial layer; and an active device formed on a second region of said epitaxial layer, said first and second regions comprising first and second mesa regions respectively, said first region carrying at least a first electrode defined by first and second, mutually opposing sidewalls and a second electrode defined by third and fourth, mutually opposing sidewalls, said first and second sidewalls of said first electrode being in a relationship with respect to a sidewall of said first mesa region such that each of said first and second sidewalls is offset away from a hypothetical extension of said sidewall of said first mesa region in an inward direction of said first mesa region, said fourth sidewall of said second electrode being in a flush relationship with said sidewall of said first mesa region.

Another object of the present invention is to provide a semiconductor integrated circuit device, comprising:

a substrate carrying thereon an epitaxial layer;

a resistance element formed on a first region of said epitaxial layer;

an active device formed on a second region of said epitaxial layer, said first and second regions comprising first and second mesa regions respectively;

a dummy pattern provided over said first mesa region such that said dummy pattern includes therein one or more openings with a separation from a mesa sidewall defining said first mesa structure;

a first electrode provided on said epitaxial layer in correspondence to said opening; and a second electrode provided on said epitaxial layer outside of said dummy pattern.

Another object of the present invention is to provide a semiconductor integrated circuit device, comprising:

a substrate carrying thereon an epitaxial layer;

a resistance element formed on a first region of said epitaxial layer;

an active device formed on a second region of said epitaxial layer, said first and second regions comprising first and second mesa regions respectively;

a dummy pattern provided over said first mesa region such that said dummy pattern extends across a lateral boundary of said first mesa region at one or more locations;

a first electrode provided on said first mesa region at a first side of said dummy pattern; and a second electrode provided on said first mesa region at a second, opposite side of said dummy pattern, said dummy pattern forming a closed ring-shaped pattern.

Another object of the present invention is to provide a method of fabricating a semiconductor integrated circuit device, comprising the steps of:

forming a semiconductor layer and a first metal layer consecutively on a base layer formed epitaxially on a substrate;

patterning said first metal layer and said semiconductor layer consecutively to form a bipolar transistor in a first region of said base layer and a dummy pattern on a second region of said base layer, such that said bipolar transistor comprises an emitter layer formed from said semiconductor layer and an emitter electrode formed from said metal layer and such that said dummy pattern comprises a dummy emitter layer formed from said semiconductor layer and a dummy emitter electrode formed from said metal layer;

depositing a second metal layer on said base layer so as to cover said first and second regions while using said emitter electrode in said first region as a self-alignment mask and using said dummy emitter electrode in said second region as a self-alignment mask; and forming a first mesa structure in said first region and a second mesa structure in said second region while using a mask having a first mask opening corresponding to said first region and a second mask opening corresponding to said second region.

According to the present invention, it is possible to form at least one of the electrodes constituting a terminal of a resistance element in a resistance-element region in such a manner that the electrode is offset away from the sidewall surface of the mesa structure that provides the resistance-element region. In such a construction, the problem of short circuit of the resistance element is positively eliminated even in such a case in which a patterning residue remains on the mesa sidewall surface at the time of self-aligned patterning process of the electrodes of the resistance terminals, which is conducted by using a dummy pattern as a self-alignment mask. The process of forming such a dummy pattern can be conducted simultaneously to the process of forming an emitter electrode. Thus, the process of the present invention can avoid extraneous process steps.

Other objects and further features of the present invention will become apparent from the following detailed description when read in conjunction with the attached drawings.

BRIEF DESCRIPTION OF THE DRAWINGS

FIGS. 2A and 2B are diagrams showing a mask used in the fabrication process of the semiconductor integrated circuit device of FIGS. 1A and 1B;

FIGS. 6A–6E are diagrams showing the fabrication process of the semiconductor integrated circuit device of the first embodiment;

FIGS. 8A and 8B are diagrams showing the construction of a semiconductor integrated circuit according to a third embodiment of the present invention;

FIGS. 9A and 9B are diagrams showing the construction of a semiconductor integrated circuit according to a fourth embodiment of the present invention; and FIGS. 10A–10D are diagrams showing the construction of a semiconductor integrated circuit according to a fifth embodiment of the present invention.

DETAILED DESCRIPTION OF THE INVENTION

First Embodiment

Figure 5A:
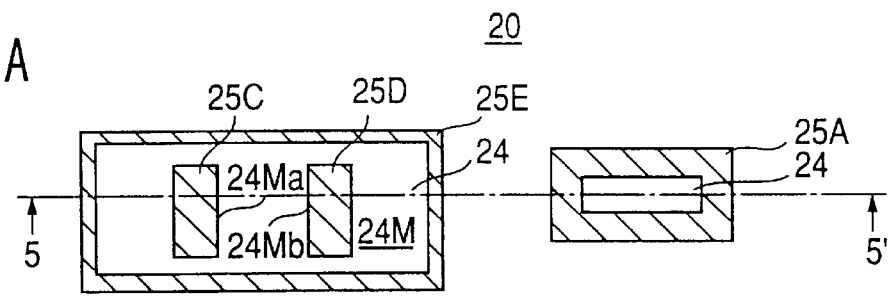
FIGS. 5A–5C are diagrams showing the construction of a semiconductor integrated circuit device according to a first embodiment of the present invention.
Figure 5B:
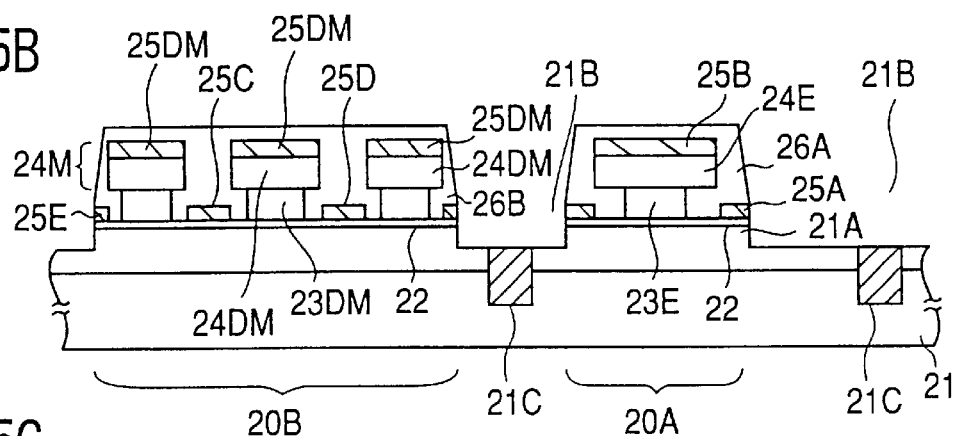
Figure 5C:
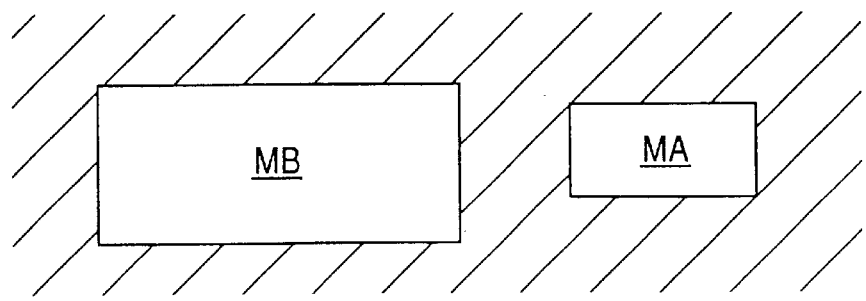

FIGS. 5A–5C show the construction of a semiconductor integrated circuit device 20 according to a first embodiment of the present invention, wherein FIG. 5A shows the semiconductor integrated circuit device 20 in a plan view while FIG. 5B shows the semiconductor integrated circuit device 20 in a cross-sectional view taken along a line 5–5' of FIG. 5A.

Referring to FIG. 5A, a semi-insulating GaAs substrate 21 is covered with a collector layer 21A of n-type GaAs and a thin base layer 22 of p-type GaAs is formed on the collector layer 21A epitaxially. Further, an emitter pattern 23E of $n^+$-type GaInP is formed on the base layer 22 epitaxially.

The substrate 21 includes an active device region 20A and a resistance-element region 20B divided from each other by a device isolation trench 21B, and the active device region 20A and the resistance-element region 20B thus defined by the device isolation trench 21B form respective mesa structures. Although not illustrated, there is provided a collector contact layer of $n^+$-type underneath the active device region in the form of a buried layer.

Figures 1A, 1B:
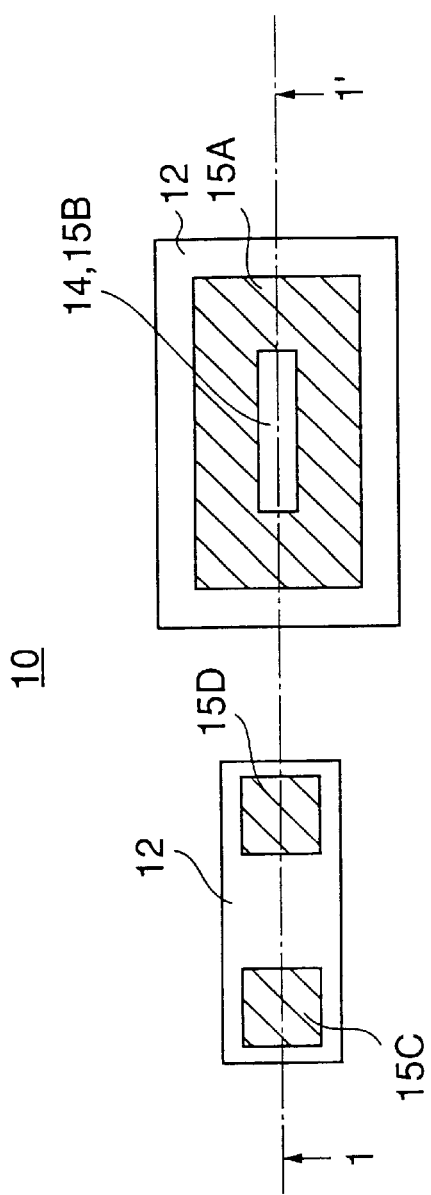
FIGS. 1A and 1B are diagrams showing the construction of a semiconductor integrated circuit device according to a related art.

In the active device region 20A, it should be noted that the emitter pattern 23E forms reduced size area (designated hereinafter as "emitter pattern 23") so as to minimize the base-emitter parasitic capacitance, and a ring-shaped base electrode 25A is formed on the exposed surface of the base layer 22 similarly to the base electrode 15A of FIG. 1A. Further, an emitter electrode 24E is formed on the emitter pattern 23E noted above. As a result of the lateral etching process applied to the emitter pattern 23E for reducing the lateral size thereof, the emitter electrode 24E extends laterally beyond the outer periphery of the emitter pattern 23E and forms an overhang structure. It should be noted that the emitter electrode 24E is used also for the self-alignment mask at the time of forming the base electrode 25A. In the present embodiment, a conductive layer 25B substantially identical in composition with the base electrode 25A is deposited on the emitter electrode 24E at the time of forming the base electrode 25A while using the emitter electrode 24E as the self-aligned mask.

In the resistance-element region 20B, on the other hand, electrodes 25C and 25D are formed on the same base layer 22, and thus, there is formed a resistance element in the resistance-element region 20B such that the resistance element has terminals provided by the electrodes 25C and 25D and the resistance medium provided by the base layer 22. In the description hereinafter, the resistance element thus formed in the resistance-element region 20B will be referred to also by the same reference numeral 20B and the HBT formed in the active device region 20A will be referred to also by the same reference numeral 20A.

As will be understood from FIGS. 5A and 5B, there is formed a dummy emitter pattern 23DM in the resistance-element region 20B in correspondence to the emitter pattern 23E formed in the active device region 20A. Similarly, a dummy emitter electrode 24DM is formed on the dummy emitter pattern 23DM in correspondence to the emitter electrode 24E. The electrodes 25C and 25D are formed in correspondence to openings 24Ma and 24Mb formed in the dummy pattern 24M respectively. The dummy emitter electrode 24DM carries thereon a conductive layer 25DM in correspondence to the conductive layer 25B. In such a structure, there is formed a resistance element between the electrodes 25C and 25D with the resistance body provided by the base layer 22.

It should be noted that the structure of FIGS. 5A and 5B further includes resist patterns 26A and 26B formed by a mask having mask openings MA and MB represented in FIG. 5C such that the resist pattern 26A corresponds to the mask opening MA and the resist pattern 26B corresponds to the mask opening MB. By patterning the structure the base layer 22 including the conductive layer thereon, the collector layer 21A underneath the base layer 22 and further a part of the substrate 21 while using the resist patterns 26A and 26B as an etching mask, it can be seen that there is formed a first mesa structure in correspondence to the active device region 20A and a second mesa structure in correspondence to the resistance-element region 20B. In the description hereinafter, the first mesa region may be designated also by the reference numeral 20A and the second mesa region may be designated also by the reference numeral 20B.

As a result of the formation of the first and second mesa structures 20A and 20B conducted by using the mask of FIG. 5C, it can be seen that the base electrode 25A is formed on the mesa structure 20A with a ring-shaped form surrounding the emitter electrode 24 as represented in the plan view of FIG. 5A. On the mesa structure 20B, on the other hand, there is formed a ring-shaped conductive pattern 25E as a result of the patterning process with a composition identical with those of the electrodes 25C and 25D such that the ring-shaped conductive pattern 25E extends along the sidewall surface of the mesa structure 20B.

In the semiconductor integrated circuit 20 of the present embodiment, it should be noted that not only the base electrode 25A but also the electrodes 25C and 25D of the resistance element are formed as a result of the self-alignment process. Thus, there is no need of employing a mask process other than the mask process for forming the mesa structures 20A and 20B. Further, it should be noted that there is no need of securing a tolerance for possible mask misalignment, and the area of the mesa region 20A on which the HBT is to be formed can be successfully minimized.

In the structure of FIGS. 5A and 5B, there is a possibility that a conductive residue is formed on the mesa sidewall surface associated with the patterning process of the electrode 25E at the time of formation of the mesa region 20B conducted by an ion milling process. However, such a formation of the patterning residue does not cause a problem at all in the present embodiment as the electrodes 25C and 25D of the resistance element are formed on the inner area of the mesa region 20B at the location away from the mesa sidewall surface. Further, it is possible to form the resistance element between the electrode 25C or 25D and the electrode 25E.

FIGS. 6A–6E show the fabrication process of the semiconductor integrated circuit device of the present embodiment. In the drawings, those parts corresponding to the parts described previously are designated by the same reference numerals and the description thereof will be omitted.

Referring to FIG. 6A, the collector layer 21A of n-type GaAs is formed on the semi-insulating substrate 21 epitaxially, and the base layer 22 of p-type GaAs is formed on the collector layer 21A epitaxially. Further, the emitter layer 23 of $n^+$-type InGaP is formed on the base layer 22 epitaxially, and the emitter layer 23 is covered by the electrode layer 24.

Next, in the step of FIG. 6B, resist patterns RA and RB are formed on the electrode layer 24 by a resist process respectively in corresondence to the active device region 20A and the resistance-element region 20B, and the electrode layer 24 and the underlying emitter layer 23 are patterned while using the resist patterns RA and RB as a mask. As a result of the patterning process, the emitter pattern 23E and the emitter electrode 24E are formed in the device region 20A and the dummy emitter electrode 24DM and the dummy emitter pattern 23DM are formed in the resistance-element region 20B.

The left drawing of FIG. 6B represents the dummy emitter electrode 24DM thus formed in a plan view. As can be seen from FIG. 6B, the dummy emitter electrode 24DM includes the openings 24Ma and 24Mb so as to expose the surface of the base layer 22.

After the formation of the emitter pattern 23E and the dummy emitter pattern 23DM, the emitter pattern 23E and the dummy emitter pattern 23DM are subjected to a lateral etching process.

Next, in the step of FIG. 6C, the resist patterns RA and RB are removed and the conductive layer 25 is deposited on the base layer 22 while using the emitter electrode 24E and the dummy emitter electrode 24DM as a self-alignment mask. As a result, the conductive layer 25 is formed on the base layer 22 at both lateral sides of the emitter electrode 24E in the active device region 20A. In the resistance-element region 20B, on the other hand, the conductive layer 25 forms a uniform conductive layer outside the dummy-emitter electrode 24DM. In the inner side of the dummy-emitter electrode 24DM, the electrodes 25C and 25D are formed in correspondence to the openings 24Ma and 24Mb of FIG. 6B in a self-alignment manner.

Associated with the deposition of the conductive layer 25, the conductive pattern 25B and the conductive pattern 25DM are formed respectively on the emitter electrode 24 and on the dummy-emitter electrode 24DM.

Figure 6D:
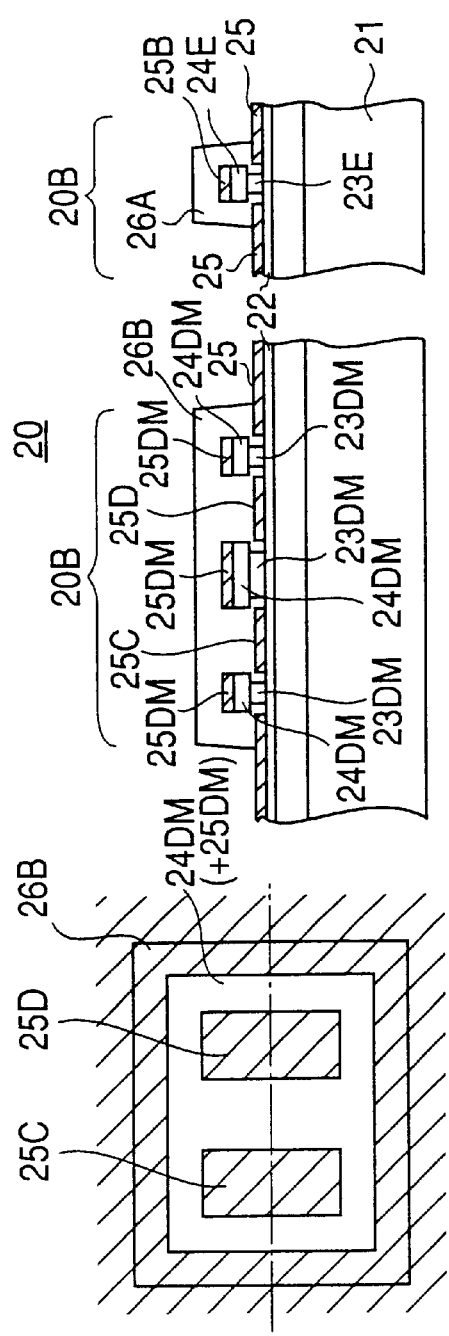

Next, in the step of FIG. 6D, the mask of FIG. 5C is used and the resist patterns 26A and 26B are formed respectively on the active device region 20A and on the resistance-element region 20B. Thereby, it should be noted that the electrodes 25C and 25D are completely included in the resist pattern 26B together with the dummy-emitter pattern 24DM.

Figure 6E:
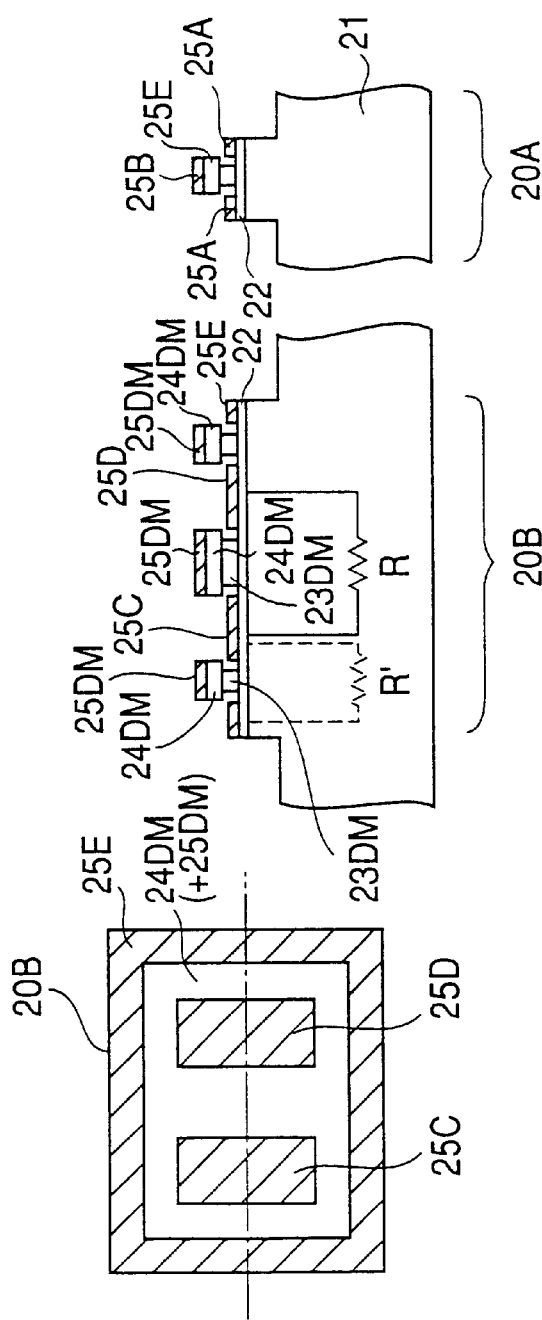

Next, in the step of FIG. 6E, an ion milling process or a dry etching process is applied while using the resist patterns 26A and 26B as a mask, and the first and second mesa structures are formed respectively in correspondence to the active device region 20A and the resistance-element region 20B. As a result of formation of the mesa structures, the conductive layer 25 also undergoes patterning and the base electrode 25A is formed in the active device region 20A. In the resistance-element region 20B, the ring-shaped electrode 25E is formed.

As explained previously, the semiconductor integrated circuit device 20 of the foregoing construction is free from the problem of the short circuit of the resistance element even in such a case a conductive residue is deposited on the sidewall surface of the mesa structure 20B due to the fact that the electrodes 25C and 25D of the resistance element are formed inside the area of the mesa structure 20B with an offset from the mesa sidewall surface. Further, it is possible to form a resistance element R' between the electrode 25E and the electrode 25C or 25D as represented in FIG. 6D.

In view of the fact that the base electrodes 25A and the electrodes 25C and 25D are formed in a self-alignment process, there is no additional mask process other than the mask process for forming the mesa structure, contrary to the fabrication process of the semiconductor integrated circuit 10 of the related art, and there is no need for alignment of the masks. Thus, the present invention can successfully minimize the area of the mesa region, and hence the base-collector capacitance in the active device region 20A.

Second Embodiment

Figure 7A:
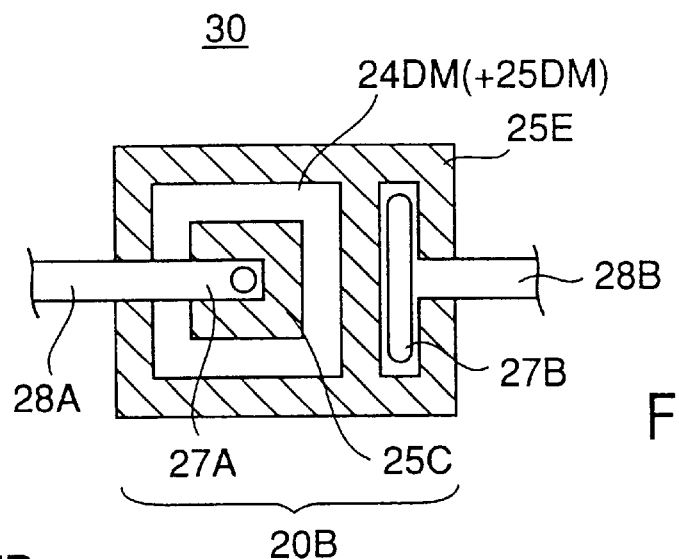
FIGS. 7A–7C are diagrams showing the construction of a semiconductor integrated circuit according to a second embodiment of the present invention.
Figure 7B:
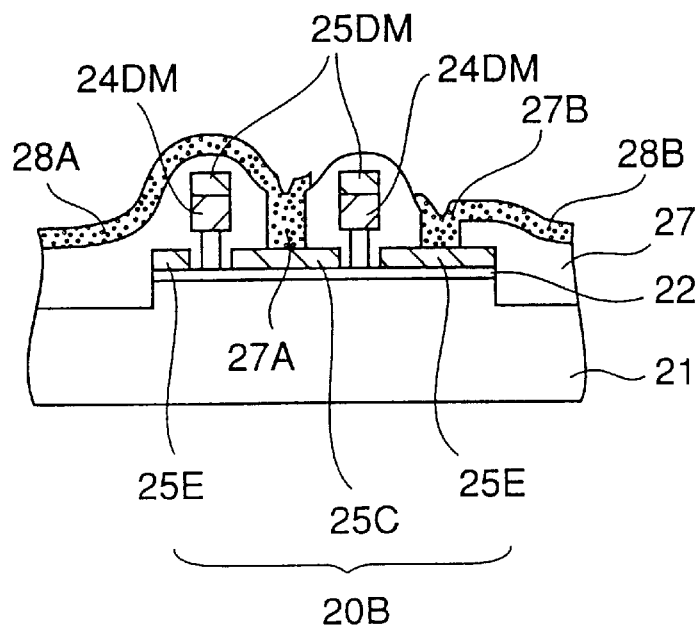

FIGS. 7A and 7B show the construction of a semiconductor integrated circuit device 30 according to a second embodiment of the present invention respectively in a plan view and in a cross-sectional view. FIGS. 7A and 7B show in particular the construction of the resistance-element region 20B used therein. In the drawings, those parts corresponding to the parts described previously are designated by the same reference numerals and the description thereof will be omitted.

Referring to FIGS. 7A and 7B, the present embodiment utilizes the electrode 25E formed along the outer periphery of the mesa region 20B also for the electrode of the resistance element, in addition to the electrode 25C. Associated with this, the number of the dummy emitter electrodes 24DM is reduced to two when viewed in the cross-section of FIG. 7B, contrary to the previous embodiment. Further, the number of the openings in the dummy-emitter electrode 24DM is reduced to one.

In the present embodiment, an interlayer insulation film 27 is provided so as to cover the dummy-emitter electrode 24DM and the conductive layer 25DM thereon as represented in FIG. 7B, wherein the interlayer insulation film 27 is provided with contact holes 27A and 27B so as to expose the electrodes 25C and 25E respectively. Further, there is provided a conductor pattern 28A on the interlayer insulation film 27 in contact with the electrode 25C at the contact hole 27A, and another conductor pattern 28B is formed on the interlayer insulation film 27 in contact with the electrode 25E at the contact hole 27B.

In such a construction, too, there occurs no problem of short-circuit in the resistance element even in such a case a conductive patterning residue remains on the sidewall surface of the mesa region 20B as the electrode 25C is formed inside the mesa region 20B.

Figure 7C:
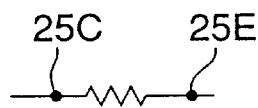

FIGS. 7C shows an equivalent circuit diagram of the resistance element of FIGS. 7A and 7B.

As can be seen from FIG. 7C, a resistor having the electrodes 25C and 25E as terminals is obtained.

Third Embodiment

FIG. 8A represents the construction of a semiconductor integrated circuit device 40 according to a third embodiment of the present invention, particularly the construction of the resistance-element region 20B used therein, while FIG. 8B shows the equivalent circuit of the resistance element formed in the resistance-element region 20B. In the drawings, those parts corresponding to the parts described previously are designated by the same reference numerals and the description thereof will be omitted.

Referring to FIG. 8A, it can be seen that there is formed a pair of dummy-emitter electrodes 24DM each having an opening on the resistance-device region 20B of the mesa structure and that the electrodes 25C and 25D are formed in correspondence to these openings respectively.

The resistance-element device of FIG. 8A is also covered with an interlayer insulation film (not shown) similarly to the construction of FIG. 7B and a conductor pattern corresponding to the conductor pattern 28A of FIG. 7B makes a contact with the electrode 25C via a contact hole and a conductor pattern corresponding to the conductor pattern 28B of FIG. 7B makes a contact with the electrode 25E. Further, a conductor pattern corresponding to the conductor pattern 28C makes a contact with the electrode 25D via a contact hole.

As a result, there is formed a resistance element having an equivalent circuit diagram as represented in FIG. 8B, wherein it can be seen that two resistors each having a resistance body provided by the base layer 22 are connected in series.

Fourth Embodiment

FIG. 9A shows the construction of a semiconductor integrated circuit device 50 according to a fourth embodiment of the present invention, particularly to the construction of the resistance-element region 20B used therein, while FIG. 9B shows the resistance element thus formed in the resistance-element region 20B in an equivalent circuit diagram. In the drawings, those parts corresponding to the parts described previously are designated by the same reference numerals and the description thereof will be omitted.

Referring to FIG. 9A, it can be seen that a first ring-shaped dummy-emitter electrode $(24DM)_1$ is provided on the mesa structure that constitutes the resistance-element region 20B in such a manner that a single opening is formed inside the first ring-shaped electrode $(24DM)_1$, and a second ring-shaped electrode $(24DM)_2$ having a single opening therein is provided inside the opening of the first ring-shaped electrode $(24DM)_1$ in a concentric relationship with respect to the first ring-shaped electrode $(24DM)_1$. Thereby, the electrode 25C now extends in a ring-shaped form in correspondence to the ring-shaped gap between the first ring-shaped dummy-emitter electrode $(24DM)_1$ and the second ring-shaped dummy-emitter electrode $(24DM)_2$, and the electrode 25D is now formed in correspondence to the foregoing central opening in the dummy-emitter electrode $(24DM)_2$.

It should be noted that the resistance element of FIG. 9A is covered also by an interlayer insulation film similar to that explained with reference to FIG. 7B, and a conductor pattern (not shown) on the interlayer insulation film makes a contact with the electrode 25C via a corresponding contact hole. Further, another conductor pattern (not shown) on the interlayer insulation film makes a contact with the electrode 25E via a contact hole, and a further conductor pattern (not shown) on the interlayer insulation film makes a contact with the electrode 25D via a corresponding contact hole.

As a result, a resistance element having an equivalent circuit diagram as represented in FIG. 9B is obtained in which it can be seen that two resistors each having a resistance body provided by the base layer 22 are connected in series.

Fifth Embodiment

FIGS. 10A and 10B show the construction of a semiconductor integrated circuit device 60 according to a fifth embodiment of the present invention, particularly the construction of the resistance-element region 20B used therein, wherein FIG. 10A shows the resistance-element region 20B in a plan view taken along a line X–X' while FIG. 10B shows the resistance-element region 20B taken along a line Y–Y'. In the drawings, those parts corresponding to the parts described previously are designated by the same reference numerals and the description thereof will be omitted.

Referring to FIG. 10A, the dummy-emitter electrode 24DM of the present embodiment is formed to have an elongated ring-shaped form and a first resistance element carrying the electrodes 15C and 15D and having the cross-section of FIG. 10B is formed so as to intersect with a part of the ring-shaped dummy-emitter electrode 24DM. Further, there is formed a second resistance element carrying the electrode 25C and 25D and having the cross-section of FIG. 10C is formed with an offset from the first resistance element.

It should be noted that the cross-section of FIG. 10C corresponds to the cross-section of FIG. 7B explained previously, while the cross-section of FIG. 10B corresponds to the cross-section explained previously with reference to FIG. 3B.

Figure 3A:
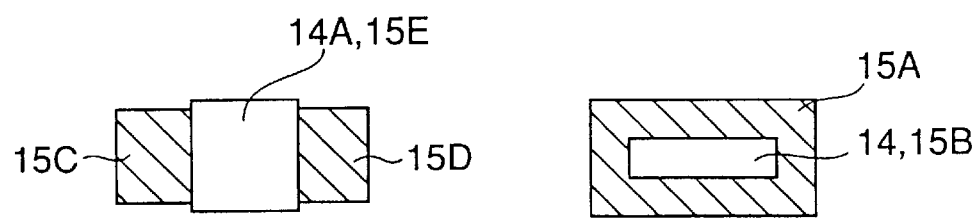
FIGS. 3A–3C are diagrams showing a possible improvement of the semiconductor integrated circuit device of FIGS. 1A and 1B.
Figure 3B:
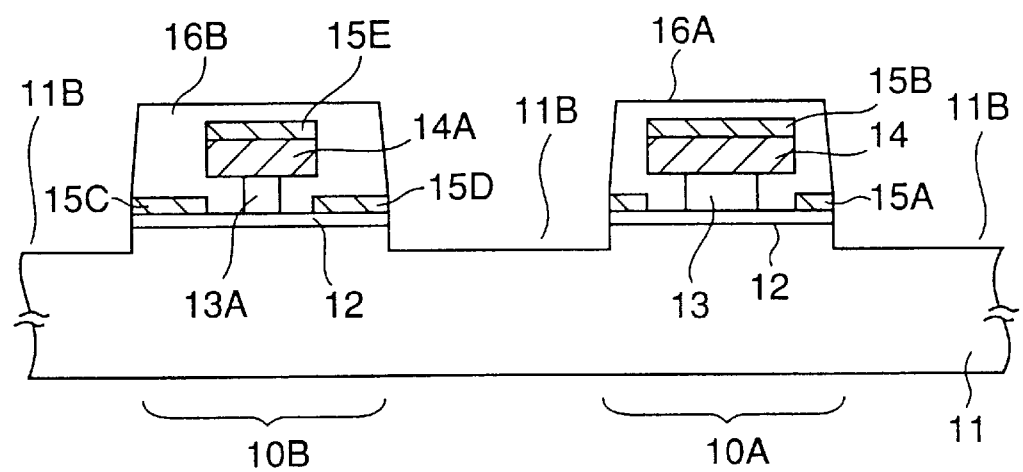
Figure 3C:
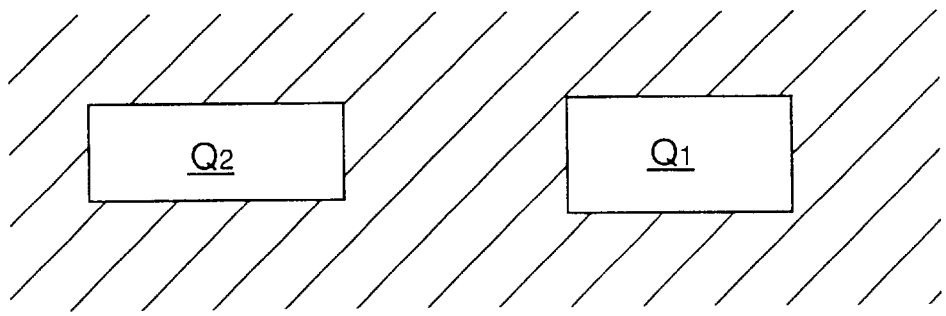
Figure 4A:
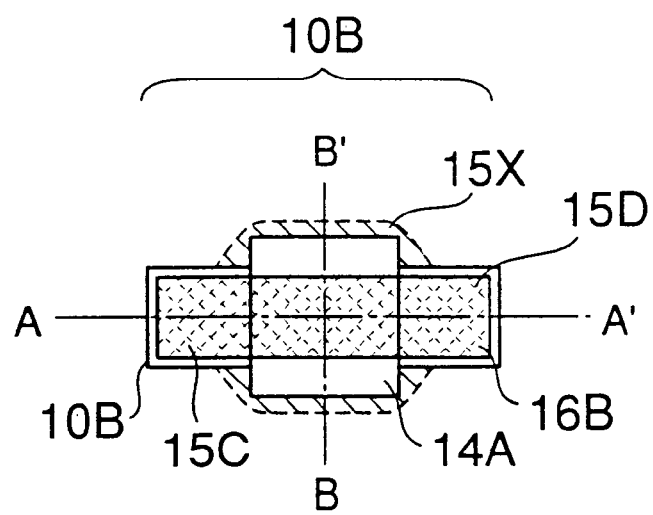
FIGS. 4A–4C are diagrams showing the problems predicted in the semiconductor integrated circuit of FIGS. 3A–3C.
Figure 4B:
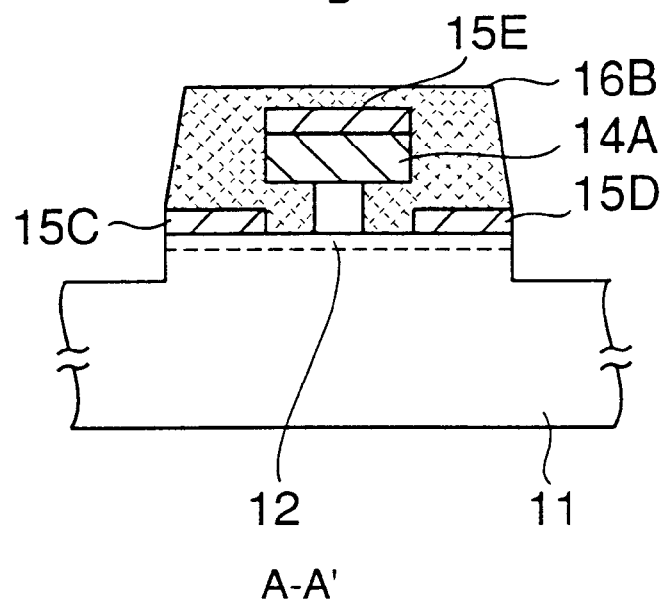
Figure 4C:
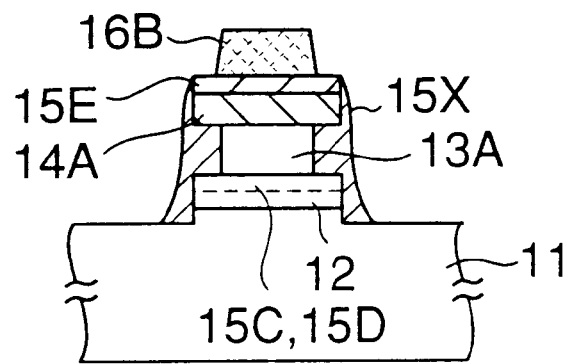

In the resistance element of FIG. 3B, there is a possibility of short circuit in the event there remains a conductive patterning residue on the sidewall surface of the mesa structure. In the resistance element of FIG. 10A, on the other hand, there occurs no such a short-circuit even when there remains a conductive residue, as the dummy-emitter electrode 24DM forms a closed ring-shaped form dividing the interior region of the ring from the exterior region of the ring. Thus, even when a patterning residue remains on the inner mesa sidewall surface, the patterning residue is spatially as well as electrically isolated from the patterning residue on the outer mesa sidewall surface, and no problem of short-circuit is caused. Thus, there is provided a single resistor having terminals 15C and 15D as represented in the equivalent circuit diagram of FIG. 10A.

It should be noted that the cross-sectional structure of FIG. 10C is distinct over the cross-sectional structure of FIG. 7B in the point that the ring-shaped electrode 25E of FIG. 7B is now divided into a first electrode pattern 25E$_1$ and a second electrode pattern 25E$_2$. Thus, there is formed another resistance element represented in FIG. 10D in which two resistors are connected in series.

In the present invention, it should be noted that the active device is by no means limited to an HBT as explained before, but other active devices including an ordinary bipolar transistor or an FET may be formed for the active device of the integrated circuit device.

Further, the present invention is not limited to the embodiments described heretofore, but various variations and modifications may be made without departing from the scope of the invention.

What is claimed is:

1. A semiconductor integrated circuit device, comprising:
   a substrate carrying thereon an epitaxial layer;
   a resistance element formed on a first region of said epitaxial layer; and
   an active device formed on a second region of said epitaxial layer,
   said first and second regions comprising first and second mesa regions respectively, said first and second regions being formed as a part of said epitaxial layer,
   said first region including at least a first metal electrode defined by first and second, mutually opposing sidewalls and a second metal electrode defined by third and fourth, mutually opposing sidewalls,
   each of said first and second sidewalls of said first electrode is offset away from a hypothetical extension of said sidewall of said first mesa region in an inward direction of said first mesa region,
   said fourth sidewall of said second electrode being in a flush relationship with said sidewall of said first mesa region.

2. A semiconductor integrated circuit device as claimed in claim 1, wherein said first region includes a dummy pattern having first and second, mutually opposing edges between said first electrode and said second electrode, in such a manner that said first edge coincides with said second sidewall of said first electrode and such that said second edge coincides with a part of said third sidewall of said second electrode, when viewed in a direction perpendicular to a principal surface of said epitaxial layer.

3. A semiconductor integrated circuit device as claimed in claim 2, wherein said dummy pattern is formed above a surface of said epitaxial layer with a separation therefrom.

4. A semiconductor integrated circuit device as claimed in claim 2, wherein said dummy pattern is defined by an outer peripheral edge including said second edge, said dummy pattern further having an opening defined by a third edge coinciding with said first sidewall when viewed in a direction perpendicular to said principal surface of said epitaxial layer.

5. A semiconductor integrated circuit device as claimed in claim 2, wherein said dummy pattern forms a closed, ring-shaped pattern in said first region, such that said ring-shaped pattern is defined by an outer peripheral edge including said second edge as a part thereof and an inner peripheral edge including said first edge as a part thereof.

6. A semiconductor integrated circuit device, comprising:
   a substrate carrying thereon an epitaxial layer;
   a resistance element formed on a first region of said epitaxial layer;
   an active device formed on a second region of said epitaxial layer, said first and second regions comprising first and second mesa regions respectively;
   a dummy pattern provided over said first mesa region such that said dummy pattern includes therein one or more openings which are located away from a mesa sidewall defining said first mesa region;
   a first electrode provided on said epitaxial layer in said opening; and
   a second electrode provided on said epitaxial layer outside of said dummy pattern.

7. A semiconductor integrated circuit as claimed in claim 6, wherein said dummy pattern comprises a metal pattern locating above said epitaxial layer with a separation from a surface of said epitaxial layer, said first electrode having a shape coincident with a shape of said opening, and wherein said second electrode has a shape corresponding to an outer peripheral shape of said dummy pattern.

8. A semiconductor integrated circuit as claimed in claim 6, wherein said second electrode is defined by a sidewall surface continuing from said mesa sidewall.

9. A semiconductor integrated circuit as claimed in claim 6, further comprising another dummy pattern inside said opening, said another dummy pattern having another opening therein, in such a relationship that said another dummy pattern is separated from an inner edge of said opening, said epitaxial layer further carrying thereon a third electrode in correspondence to said another opening.

10. A semiconductor integrated circuit device, comprising:

a substrate carrying thereon an epitaxial layer;

a resistance element formed on a first region of said epitaxial layer;

an active device formed on a second region of said epitaxial layer, said first and second regions comprising first and second mesa regions respectively;

a dummy pattern provided over said first mesa region such that said dummy pattern extends across a lateral boundary of said first mesa region at one or more locations;

a first electrode provided on said first mesa region at a first side of said dummy pattern; and a second electrode provided on said first mesa region at a second, opposite side of said dummy pattern, said dummy pattern forming a closed ring-shaped pattern.

11. A semiconductor integrated circuit as claimed in claim 10 wherein said active device comprises a heterobipolar transistor having said epitaxial layer as a base layer.

12. A semiconductor integrated circuit as claimed in claim 11 wherein said dummy pattern has a composition and a thickness substantially identical with a composition and a thickness of an emitter electrode of said heterobipolar transistor.

* * * * *